(12) United States Patent
Karda et al.

(10) Patent No.: US 11,715,797 B2
(45) Date of Patent: Aug. 1, 2023

(54) FERROELECTRIC TRANSISTORS AND ASSEMBLIES COMPRISING FERROELECTRIC TRANSISTORS

(71) Applicant: Micron Technology, Inc., Boise, ID (US)

(72) Inventors: Kamal M. Karda, Boise, ID (US); Haitao Liu, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 11 days.

(21) Appl. No.: 16/983,841

(22) Filed: Aug. 3, 2020

(65) Prior Publication Data

US 2021/0066502 A1 Mar. 4, 2021

Related U.S. Application Data

(60) Provisional application No. 62/892,117, filed on Aug. 27, 2019.

(51) Int. Cl.
*H01L 29/78* (2006.01)
*H01L 29/51* (2006.01)
*H01L 29/66* (2006.01)

(52) U.S. Cl.
CPC ...... *H01L 29/78391* (2014.09); *H01L 29/516* (2013.01); *H01L 29/6684* (2013.01);
(Continued)

(58) Field of Classification Search
CPC .......... H01L 29/516; H01L 29/66431; H01L 29/66439; H01L 29/66522; H01L 29/6684; H01L 29/78391; H01L 29/785
See application file for complete search history.

(56) References Cited

U.S. PATENT DOCUMENTS 8,742,493 B2 6/2014 Kim et al.
9,159,829 B1 10/2015 Ramaswamy
(Continued)

FOREIGN PATENT DOCUMENTS

KR 10-1820022 1/2018
WO WO 3/2022
PCT/US2020/044976

OTHER PUBLICATIONS

WO PCT/US2020/044976 Search Rep., dated Nov. 17, 2020, Micron Technoology, Inc.
(Continued)

*Primary Examiner* — Matthew E Warren
(74) *Attorney, Agent, or Firm* — Wells St. John P.S.

(57) ABSTRACT

Some embodiments include a ferroelectric transistor having a first electrode and a second electrode. The second electrode is offset from the first electrode by an active region. A transistor gate is along a portion of the active region. The active region includes a first source/drain region adjacent the first electrode, a second source/drain region adjacent the second electrode, and a body region between the first and second source/drain regions. The body region includes a gated channel region adjacent the transistor gate. The active region includes at least one barrier between the second electrode and the gated channel region which is permeable to electrons but not to holes. Ferroelectric material is between the transistor gate and the gated channel region.

31 Claims, 8 Drawing Sheets

(52) U.S. Cl.
CPC .. *H01L 29/66431* (2013.01); *H01L 29/66439* (2013.01); *H01L 29/66522* (2013.01); *H01L 29/785* (2013.01)

(56) References Cited

U.S. PATENT DOCUMENTS

| | | | |
|---|---|---|---|
| 9,263,577 | B2 | 2/2016 | Ramaswamy et al. |
| 9,281,044 | B2 | 3/2016 | Ramaswamy et al. |
| 9,337,210 | B2 | 5/2016 | Karda et al. |
| 10,062,426 | B2 | 8/2018 | Karda |
| 10,636,471 | B2 | 4/2020 | Ramaswamy et al. |
| 10,748,931 | B2 | 8/2020 | Karda et al. |
| 2008/0067495 | A1* | 3/2008 | Verhulst .............. H01L 29/0676 257/12 |
| 2017/0162702 | A1 | 6/2017 | Hu |
| 2018/0068999 | A1* | 3/2018 | Afzalian ............... H01L 29/205 |
| 2018/0301551 | A1 | 10/2018 | Majhi et al. |

OTHER PUBLICATIONS

WO PCT/US2020/044976 Writt. Opin. dated Nov. 17, 2929, Micro Tecgbikgi, Inc.
U.S. Appl. No. 15/974,141 filed May 8, 18, by Karda et al.
U.S. Appl. No. 16/046,803 filed Jul. 26, 18, by Kinney.
U.S. Appl. No. 16/188,432 filed Nov. 13, 18, by Karda et al.

* cited by examiner

FERROELECTRIC TRANSISTORS AND ASSEMBLIES COMPRISING FERROELECTRIC TRANSISTORS

RELATED PATENT DATA

This application claims priority to U.S. Provisional Patent Application Ser. No. 62/892,117 filed Aug. 27, 2019, entitled "Ferroelectric Transistors and Assemblies Comprising Ferroelectric Transistors", the entirety of which is incorporated by reference herein.

TECHNICAL FIELD

Ferroelectric transistors and assemblies comprising ferroelectric transistors.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, sense lines, or data/sense lines) and access lines (which may also be referred to as wordlines). The digit lines may conductively interconnect memory cells along columns of the array, and the access lines may conductively interconnect memory cells along rows of the array.

Memory cells may be volatile or nonvolatile. Nonvolatile memory cells can store data for extended periods of time including when the computer is turned off. Volatile memory dissipates and therefore requires being refreshed/rewritten; in many instances, multiple times per second. Regardless, memory cells are configured to retain or store memory in at least two different selectable states. In a binary system the states are considered as either a "0" or a "1". In other systems at least some individual memory cells may be configured to store more than two levels or states of information.

Ferroelectric field effect transistors (FeFETs) may be utilized as memory cells. Specifically, the FeFETs may have two selectable memory states corresponding to two different polarization modes of ferroelectric material within the FeFETs. The different polarization modes may be characterized by, for example, different threshold voltages (VT) or by different channel conductivities for a selected operating voltage. The ferroelectric polarization mode of a FeFET may remain in the absence of power (at least for a measurable duration).

One type of ferroelectric transistor is a metal-ferroelectric-metal-insulator-semiconductor (MFMIS) transistor. Such has a gate dielectric (insulator, I) between a metal (M) and a semiconductor substrate (S). Such also has ferroelectric (F) material adjacent to the metal, and has a gate (typically comprising metal, M) adjacent to the ferroelectric material. In operation, an electric field across the ferroelectric material is used to switch the ferroelectric material from one polarization mode to another. The ferroelectric transistor comprises a pair of source/drain regions, and a channel region between the source/drain regions. Conductivity across the channel region is influenced by the polarization mode of the ferroelectric material.

Another type of ferroelectric transistor is metal-ferroelectric-insulator-semiconductor (MFIS); in which ferroelectric material directly touches the insulator (i.e., in which there is no intervening metal between the ferroelectric material and the insulator).

The channel region may be considered to be contained within a body region of the ferroelectric transistor. During programming operations, carriers (holes and electrons) migrate into and out of the body region.

It is desired to develop ferroelectric transistors which may be rapidly programmed, and yet which are scalable to ever-increasing levels of integration. It is proving difficult to achieve desired rapid programming with conventional ferroelectric transistor configurations.

It would be desirable to develop new ferroelectric transistors which address the above-discussed problem, and to develop new memory array architectures utilizing such transistors.

DETAILED DESCRIPTION OF THE ILLUSTRATED EMBODIMENTS

Some embodiments include recognition that a problem with conventional ferroelectric transistors is that the body regions of such transistors may be "floating", and thus may be isolated from a source of carrier (either holes or electrons); resulting in floating-body-effects (FBE).

The floating-body-effects may be problematic during programming operations. A limiting factor in the speed of the programming operations may be the rate at which carriers are refreshed within the body regions of the transistors, and such rate may be reduced by floating-body-effects.

Some embodiments include arrangements in which a ferroelectric transistor active region extends between two electrodes. Electrons may pass between either of the electrodes and the active region, but holes are permitted to transfer to-and-from only one of the electrodes due to the presence of one or more hole-barrier-structures. The holes may be effectively supplied from said one of the electrodes during write operations (specifically, write 0 operations) to enable high-speed programming. However, since the holes are only supplied from one of the electrodes, the ferroelectric transistor may be operated in a manner such that the holes will not interfere with read operations. Example embodiments are described with reference to FIGS. 1-11.

Figure 1:
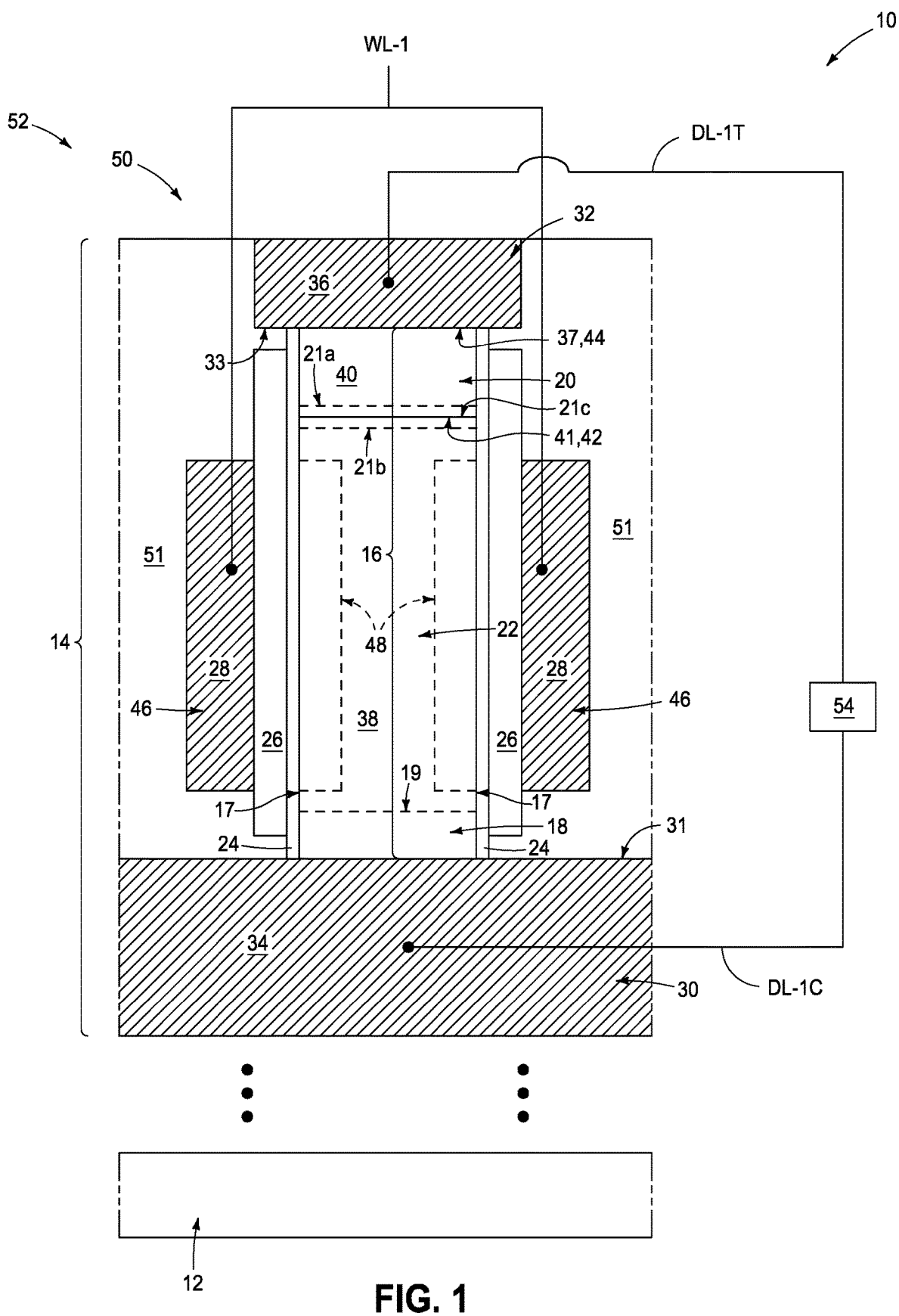
FIG. 1 is a diagrammatic cross-sectional view of a region of an example assembly.

Referring to FIG. 1, an integrated assembly 10 includes a ferroelectric transistor 14 supported by a base 12.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductor wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

A gap is provided between the base 12 and the ferroelectric transistor 14 to indicate that there may be other materials, circuit components, etc., provided between the base and the ferroelectric transistor 14 in some embodiments.

The ferroelectric transistor 14 comprises an active region 16 extending vertically between a pair of electrodes 30 and 32. The electrodes 30 and 32 may be referred to as first and second electrodes, respectively; as bottom and top electrodes, respectively; as lower and upper electrodes, respectively; etc.

The electrodes 30 and 32 comprise conductive materials 34 and 36, respectively. The conductive materials 34 and 36 may comprise any suitable electrically conductive composition(s); such as, for example, one or more of various metals (e.g., titanium, tungsten, cobalt, nickel, platinum, ruthenium, etc.) and/or metal-containing compositions (e.g., metal silicide, metal nitride, metal carbide, etc.). The conductive materials 34 and 36 may comprise a same composition as one another, or may comprise different compositions relative to one another.

The active region 16 includes a first (or lower) source/drain region 18, a second (or upper) source/drain region 20, and a body region (or channel region) 22 between the source/drain regions 18 and 20. In the illustrated embodiment, the active region 16 extends vertically relative to the base 12 (i.e., the electrodes 30 and 32 are vertically offset relative to one another). In other embodiments, the active region may have a different configuration relative to the base 12 (e.g., the electrodes 30 and 32 may be horizontally offset relative to one another).

The lower source/drain region 18 is shown to be directly against the bottom electrode 30, and the upper source/drain region 20 is shown to be directly against the upper electrode 32.

The active region 16 comprises two different semiconductor materials 38 and 40, which join at an interface 41. The semiconductor materials 38 and 40 may be referred to as first and second semiconductor materials, respectively.

In some embodiments, the interface 41 may be configured to be permeable relative to the migration of electrons, and to be impermeable relative to the migration of holes. Accordingly, the interface 41 may be configured as a hole-barrier-structure 42. In such embodiments, the first and second semiconductor materials 38 and 40 may be chosen to have conduction bands which are energetically similar to one another, and to have valence bands which are energetically offset relative to one another (as discussed in more detail below with reference to FIG. 3A).

In some embodiments, the first semiconductor material 38 may comprise a semiconductor oxide. The semiconductor oxide may comprise any suitable composition(s); and in some embodiments may include one or more of indium, zinc, tin and gallium. For instance, the semiconductor oxide may comprise, consist essentially of, or consist of a composition having oxygen in combination with tin. Such composition may be represented as SnO, where the chemical formula indicates primary constituents rather than a specific stoichiometry. In some embodiments, the semiconductor oxide may include dopant (e.g., one or more of hydrogen, magnesium, yttrium, fluorine, etc.).

In some embodiments, the second semiconductor material 40 may comprise, consist essentially of, or consist of a semiconductor composition comprising at least one element from Group 13 of the periodic table in combination with at least one element from Group 15 of the periodic table. For instance, such semiconductor composition may include one or more of GaP, AlAs, GaAs, AlP, InP, AlSb, GaAlAs, GaInAs, GaInP, etc.; where the chemical formulas indicate primary constituents rather than specific stoichiometries. In some specific embodiments, the second semiconductor material may comprise, consist essentially of, or consist of a composition comprising gallium in combination with phosphorus (e.g., GaP; where the chemical formula indicates primary constituents rather than a specific stoichiometry). In some embodiments, the second semiconductor material 40 may include dopant (e.g., one or more elements selected from Group 14 of the periodic table; such as, for example, one or more of silicon, carbon and germanium), incorporated into the semiconductor composition comprising the elements from Groups 13 and 15 of the periodic table.

A dashed line 19 is provided to show an approximate upper boundary of the lower source/drain region 18. The upper boundary may be in any suitable location within the active region 16, and corresponds to a region where doping within the active region 16 transitions from source/drain region doping associated with region 18 to lighter doping associated with the body region 22. In some embodiments, the source/drain region 18 may be heavily-doped with n-type dopant.

Example locations for the lower boundary of the upper source/drain region 20 are indicated with lines 21a-c. The dashed lines 21a and 21b are provided to show that the lower boundary of the upper source/drain region 20 may be above the interface 41, or below the interface 41. The interface is labeled as 21c to indicate that the interface itself may correspond to a lower boundary of the upper source/drain region 20.

In some embodiments, the upper semiconductor material 40 may be heavily doped with n-type dopant, and may correspond to the upper source/drain region 20. For instance, the semiconductor material 40 may comprise silicon doped to concentration of at least about $10^{19}$ atoms/cm$^3$ with n-type dopant (e.g., phosphorus). In embodiments in which the upper semiconductor material 40 is heavily doped with n-type dopant, an interface 37 between the doped semiconductor material 40 and the metal-containing electrode 36 may correspond to a hole-barrier-structure 44; and specifically may be a junction which is permeable to electrons and impermeable to holes.

In some embodiments, both of the hole-barrier-structures 42 and 44 may be incorporated into a ferroelectric transistor. In other embodiments one of the hole-barrier-structures may be omitted. In yet other embodiments, more hole-barrier-structures may be utilized than the illustrated two hole-barrier-structures.

Although the configuration of FIG. 1 is described as having structures which are barriers to holes while being permeable to electrons, persons of ordinary skill will recognize that analogous configurations could be formed with barriers which are impermeable to electrons while being permeable to holes. Specifically, electrons and holes are recognized as being carrier types. Generally, the ferroelectric transistor of FIG. 1 is configured to have one or more barriers which are permeable to one of the carrier types (e.g., electrons) while being impermeable to the other of the carrier types (e.g. holes).

The ferroelectric transistor 14 of FIG. 1 includes insulative material 24 extending along the body region 22, includes ferroelectric material 26 adjacent the insulative material, and includes conductive gate material 28 adjacent the ferroelectric material.

The insulative material 24 may comprise any suitable composition(s), and in some embodiments may comprise, consist essentially of, or consist of silicon dioxide.

The ferroelectric material 26 may comprise any suitable composition(s); and may, for example, comprise, consist essentially of, or consist of one or more materials selected from the group consisting of transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, strontium, and a rare earth element. The ferroelectric material may be provided in any suitable configuration; such as, for example, a single homogeneous material, or a laminate of two or more discrete separate materials.

The conductive material 28 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 28 may be a metal-containing material; such as, for example, a material comprising one or more of titanium nitride, tungsten nitride, tungsten, titanium, etc.

The vertically-extending active region 16 has a pair of opposing sidewalls 17 along the cross-section of FIG. 1. The sidewalls 17 extend along the body region 22, the upper source/drain region 20, and the lower source/drain region 18.

The insulative material 24 is along the opposing sidewalls 17, and the ferroelectric material 26 and conductive gate material 28 may also be considered to be along such sidewalls. The materials 24, 26 and 28 may have any suitable vertical dimensions relative to the illustrated active region 16. The insulative material 24 may extend along the entirety of the sidewalls 17, or may extend along only portions of such sidewalls. The ferroelectric material 26 may extend vertically beyond the conductive gate material 28, or not. The conductive gate material 28 may or may not overlap interfaces where the body region 22 joins to the source/drain regions 18 and 20.

The conductive gate material 28 may be considered to be configured as a transistor gate (conductive gate) 46. The transistor gate directly overlaps portions (segments, regions) 48 of the active region 16; and such portions may be considered to be gated channel regions which are adjacent to the transistor gate 46. In the illustrated embodiment, the first semiconductor material 38 extends from an upper surface 31 of the first electrode 30, across the first source/drain region 18, and across the gated channel regions 48. The second semiconductor material 40 extends from the first semiconductor material 38 to a lower surface 33 of the second electrode 32. The second semiconductor material 40 may or may not extend entirely across the source/drain region 20, depending on the location of the boundary 21 of the source/drain region 20 relative to the interface 41 between the first and second semiconductor materials 38 and 40.

Insulative material 51 is shown extending around the transistor gates 46. The insulative material 51 may comprise any suitable composition(s); and in some embodiments may comprise, consist essentially of, or consist of silicon dioxide.

The ferroelectric transistor 14 may be utilized as a memory cell 50 of a memory array 52. In such applications, the conductive gate material 28 may be coupled with a wordline WL-1, the upper electrode 32 may be coupled with a first comparative digit line DL-1T, and the lower electrode 30 may be coupled with a second comparative digit line DL-1C. The comparative digit lines DL-1T and DL-1C extend to a sense amplifier 54. The comparative digit lines DL-1T and DL-1C may be considered to correspond to a set of paired digit lines (DL-1T/DL-1C). The set comprises a true digit line (DL-1T) and a complementary digit line (DL-1C). The terms "true" and "complementary" are arbitrary. The electrical values of the true and complementary digit lines of the set are utilized together during reading/writing operations of memory cells (e.g., 50) associated with such set. In some embodiments, the true comparative digit line (DL-1T) may be referred to as a first comparative digit line, and the complementary comparative digit line (DL-1C) may be referred to as a second comparative digit line.

Figure 2:
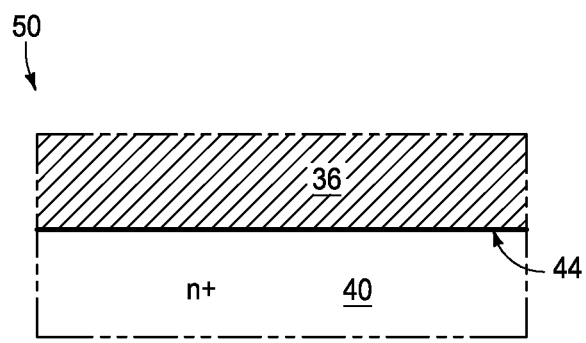
FIGS. 2 and 3 are diagrammatic cross-section views of enlarged regions of the assembly of FIG. 1.
Figure 3:
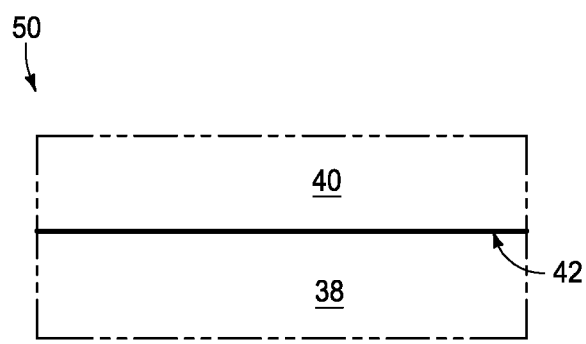

FIGS. 2 and 3 show enlarged regions of the memory cell 50 of FIG. 1 to illustrate specific configurations of the hole-barrier-structures 44 and 42.

Referring to FIG. 2, such shows a configuration in which the semiconductor material 40 is heavily doped with n-type dopant (i.e., is n+ doped). For instance, the semiconductor material 40 may comprise silicon doped to concentration of at least about $10^{19}$ atoms/cm$^3$ with n-type dopant(s) (e.g., phosphorus), and in some embodiments doped to a concentration at least about $10^{20}$ atoms/cm$^3$ with the n-type dopant(s), or even at least about $10^{22}$ atoms/cm$^3$ with the n-type dopant(s). The hole-barrier-structure 44 may correspond to an interface between metal-containing material 36 and the n-type-doped semiconductor material 40.

Figure 3A:
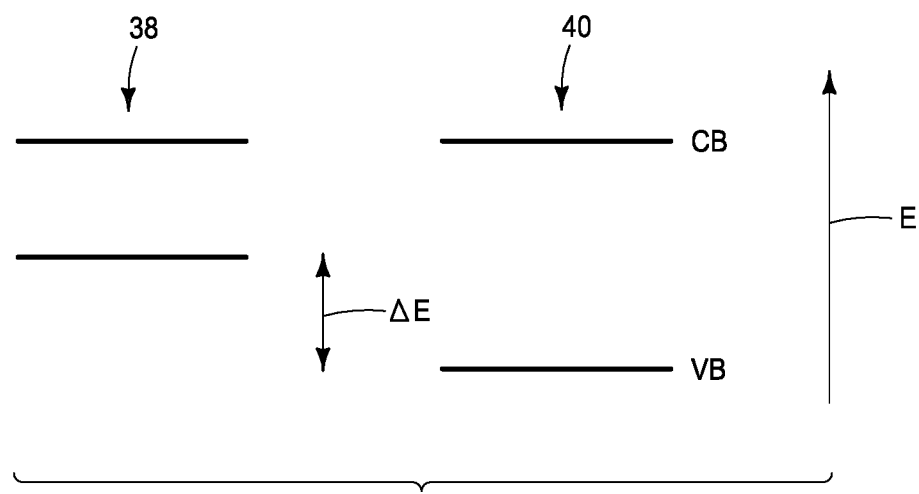
FIG. 3A diagrammatically illustrates a relationship between conductive bands and valence bands of materials shown in FIG. 3.

Referring to FIGS. 3 and 3A, such show a configuration in which the hole-barrier-structure 42 corresponds to an interface between two semiconductor materials 38 and 40 configured to have conduction bands (CB) which are substantially energetically matched (aligned) such that electrons may readily pass between the materials 38 and 40; and yet to have valence bands (VB) which are energetically offset relative to one another so that holes are substantially precluded from passing from the semiconductor material 40 into the semiconductor material 38. FIG. 3A shows the offset between the valence bands of materials 38 and 40 to be ΔE; which in some embodiments may be at least about 0.5 volts.

Figure 4:
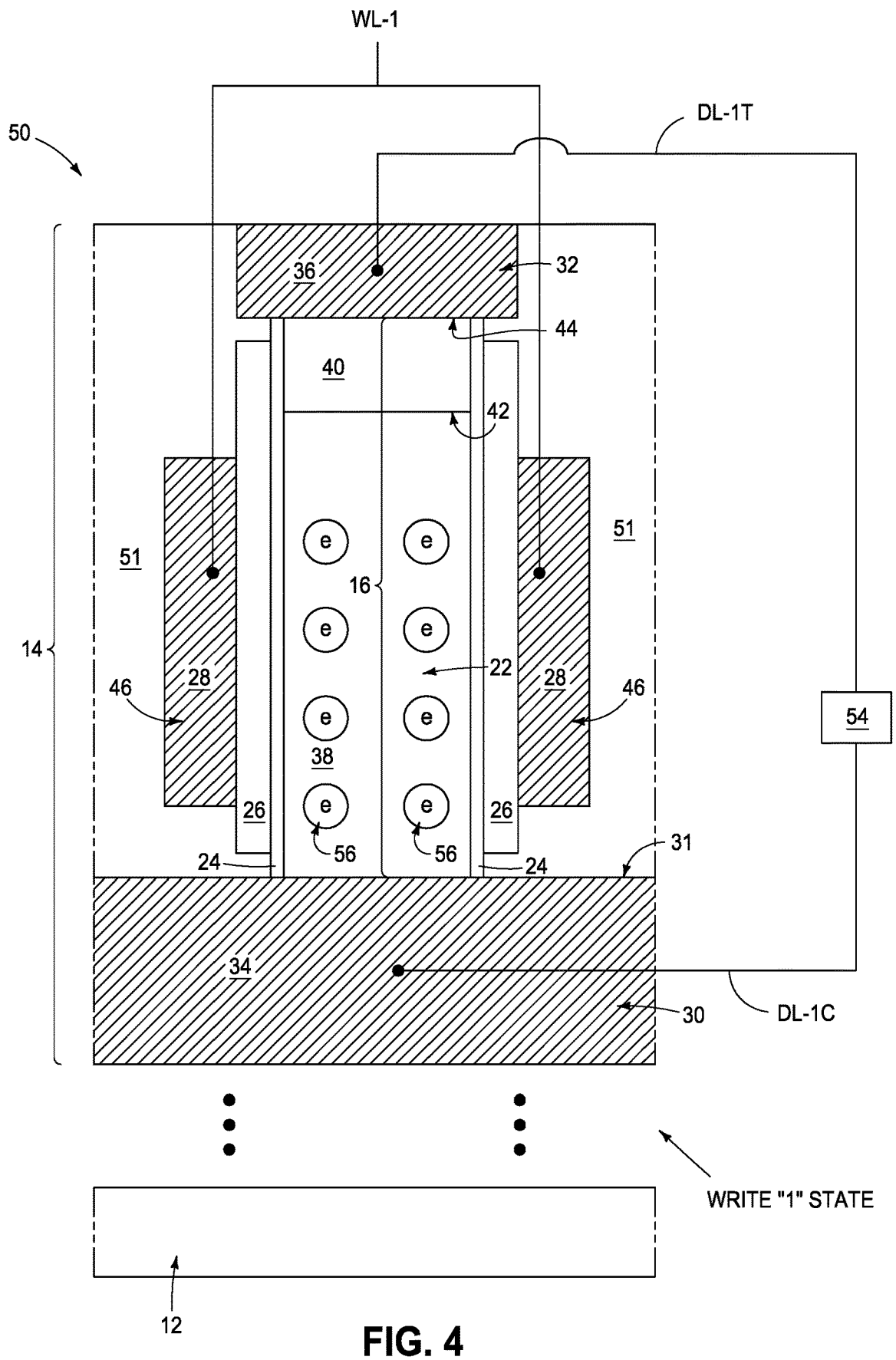
FIGS. 4-6 are diagrammatic cross-sectional view of the region of the example assembly of FIG. 1 at various programming stages.
Figure 5:
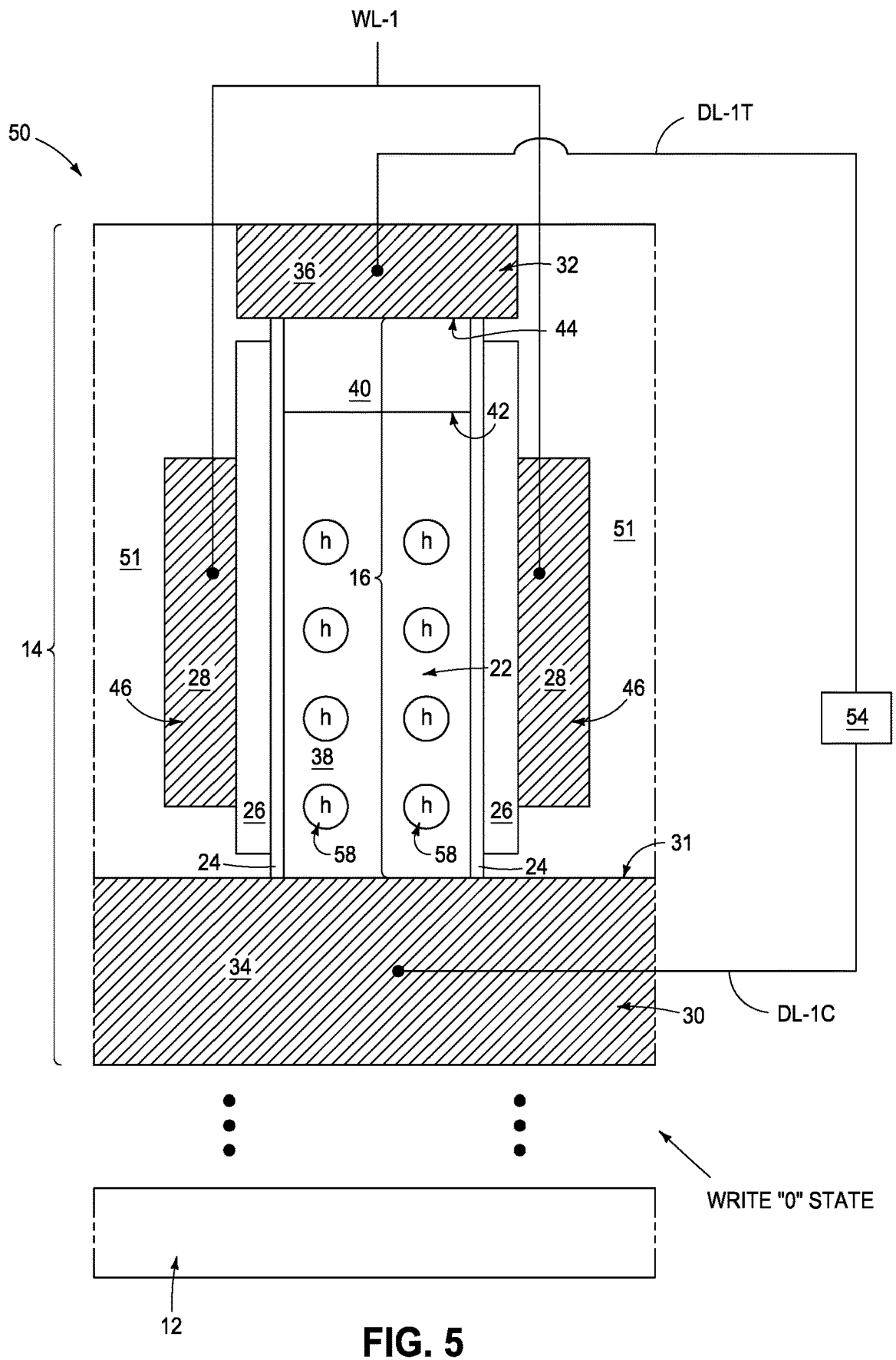
Figure 6:
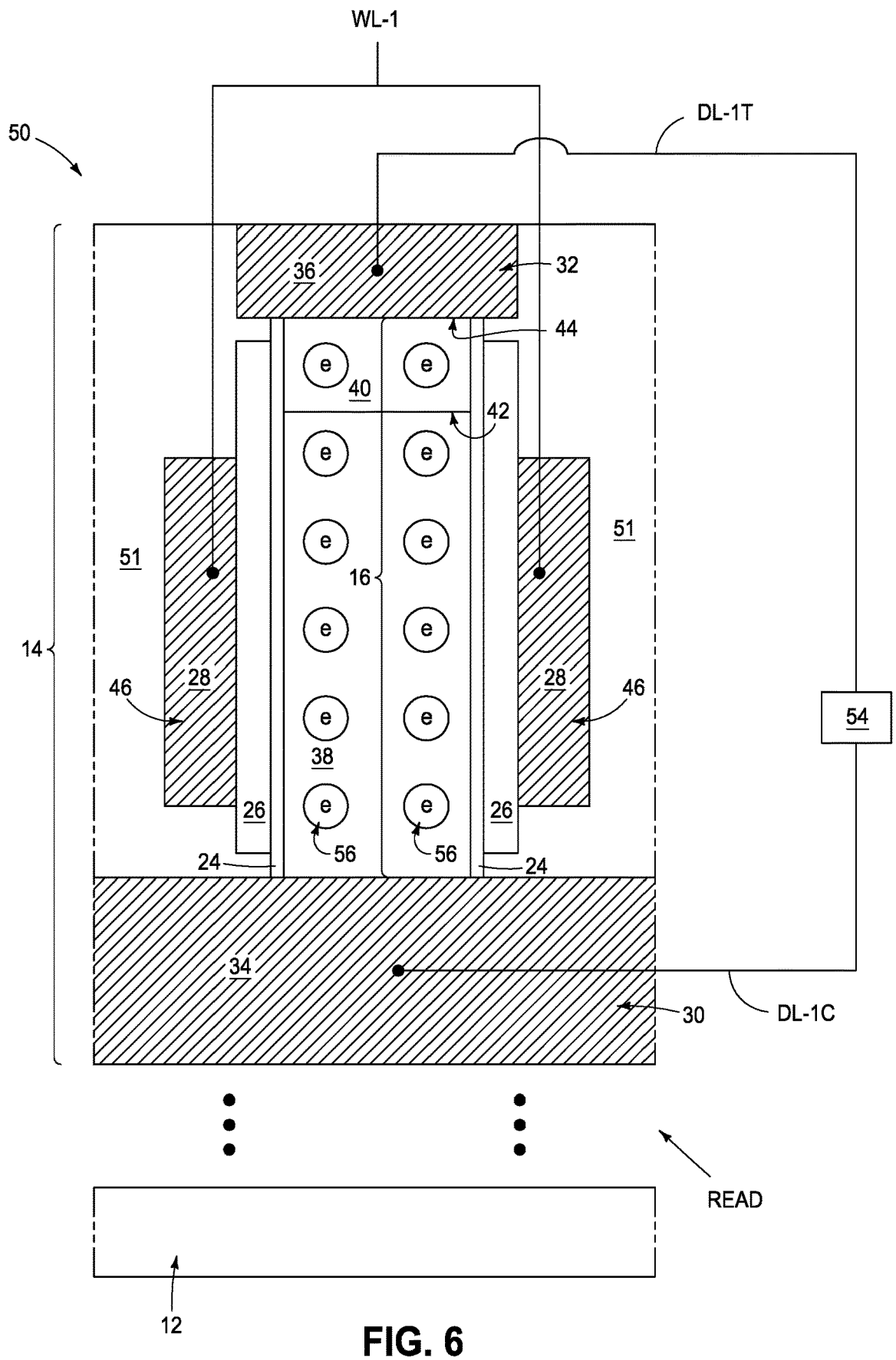
Figure 7:
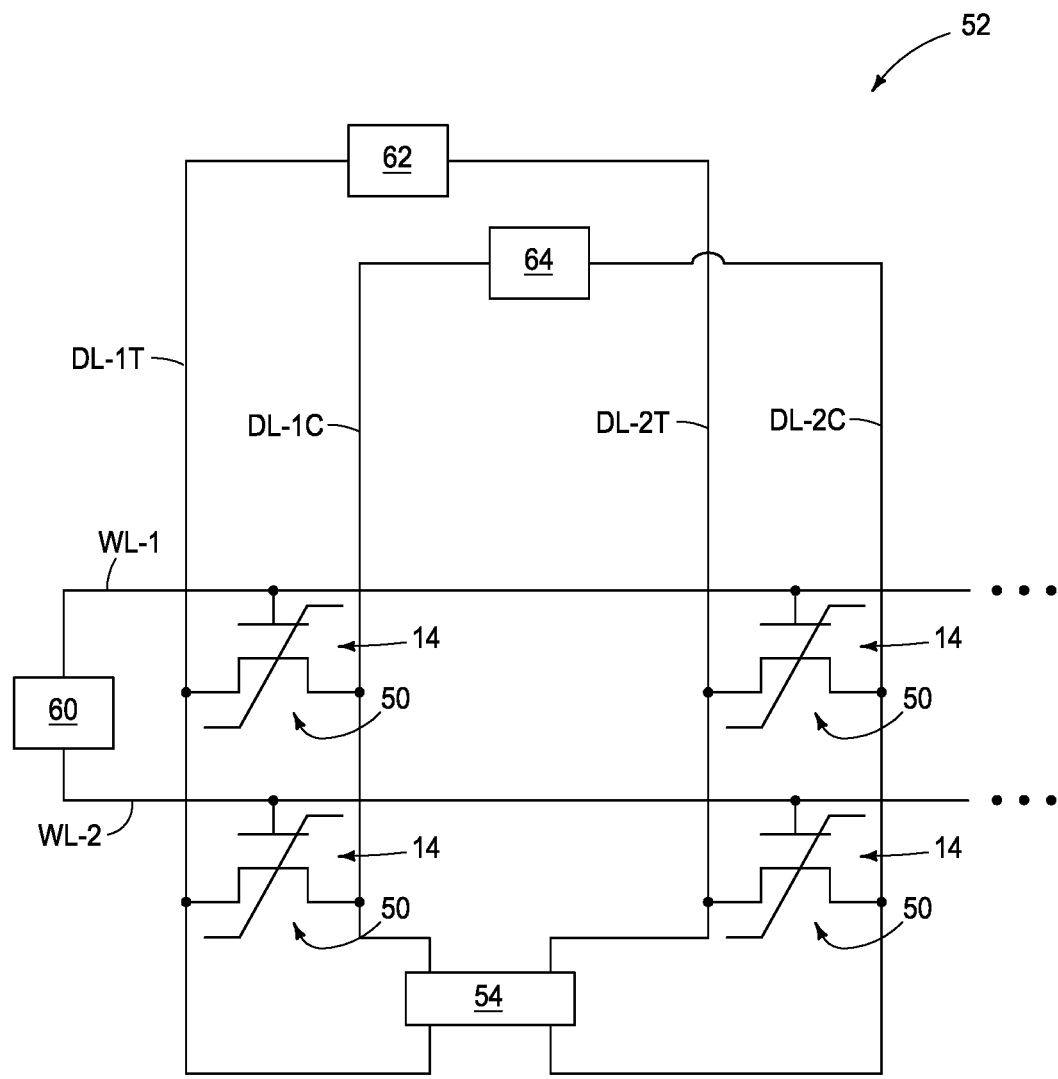
FIG. 7 is a schematic view of a region of an example memory array.

FIGS. 4-6 illustrate example operational modes of the memory cell 50.

Referring to FIG. 4, the memory cell 50 may be programmed into a first memory state (a so-called "1" state) by operating the wordline WL-1 and the digit line set DL-1T/DL-1C to form electrons 56 (only some of which are labeled) within the active region 16. The electrons may be provided from either or both of the electrodes 30 and 32 by providing electrical bias between the wordline (WL−1) and either or both of the electrodes 30, 32. The electrons 56 may be considered to be pumped from one or both of the metal-containing electrodes 30 and 32 into the channel region 48 (labeled in FIG. 1) of the body region 22. The memory state "1" may be considered to correspond to a state in which holes are depleted within the body region 22.

Referring to FIG. 5, the memory cell 50 may be programmed into a second memory state (a so-called "0" state) by operating the wordline WL-1 and the digit line set DL-1T/DL-1C to replenish holes 58 (only some of which are labeled) within the body region 22. Electrical bias may be provided between the wordline WL-1 and the bottom electrode 30; and the holes 58 may be considered to be pumped from the metal-containing bottom electrode 30 into the channel region 48 (labeled in FIG. 1) of the body region 22. The holes will not flow from the upper metal-containing electrode 32 into the body region 22 due to the presence of one or both of the hole-barrier-structures 42 and 44. Since the holes are being provided by the metal-containing structure 30, the above-described floating-body-effects may be avoided; and the "write 0" operation may occur with high programming speed.

Referring to FIG. 6, the memory cell 50 may be read by providing an electrical bias between the top and bottom electrodes 30 and 32, and providing voltage on the wordline WL-1. The electrons may readily flow across the active region 16 (from source to drain) as the barrier-structures 42 and 44 are permeable to the electrons. In some embodiments, the write operations described above may be considered to be ambipolar (i.e., to utilize both electrons and holes), and the read operation is not ambipolar in that it only utilizes electrons. Since electrons are uninhibited by the barrier-structures 42 and 44, the "read window" is not adversely impacted through utilization of the configurations described herein.

In some embodiments, the ferroelectric transistor 14 and memory cell 50 of FIG. 1 may be considered to be representative of many substantially identical structures across the memory array 52. The first and second comparative digit lines DL-1T and DL-1C are together a paired set DL-1T/DL-1C which may be representative of many substantially identical paired sets of first and second comparative digit lines across the memory array. The wordline WL-1 may be representative of many substantially identical wordlines across the memory array. The term "substantially identical" means identical to within reasonable tolerances of fabrication and measurement. An example memory array 52 is described with reference to FIG. 7.

The memory array 52 includes a plurality of memory cells 50, which each comprises a ferroelectric transistor 14. Wordlines WL-1 and WL-2 are coupled with a driver 60 (i.e., wordline driver), and extend along rows of the memory array. Digit line pairs DL-1T/DL-1C and DL-2T/DL-2C extend along columns of the memory array. The true (i.e., first) comparative digit lines DL-1T and DL-2T are coupled with a digit-line-driver 62, and the complementary (i.e., second) comparative digit lines DL-1C and DL-2C are coupled with circuitry 64 which may be driver circuitry or a reference source (the reference source may be any suitable structure held at any suitable reference voltage; e.g., ground, VCC/2, etc.). Each of the memory cells 50 is uniquely addressed through a combination of one of the wordlines and one of the sets of first and second comparative digit lines.

The true and complementary comparative digit lines (e.g., DL-1T and DL-1C) of each of the paired digit line sets (e.g., DL-1T/DL-1C) are electrically coupled with a device 54. Such device 54 may be a sense amplifier utilized to compare electrical properties of a true digit line (e.g., DL-1T) with those of a comparative digit line (e.g., DL-1C) during a READ operation. Alternatively, or additionally, the device 54 may be utilized to impart desired electrical properties to the true and complementary comparative digit lines (e.g., DL-1T and DL-1C) during a programming (i.e., WRITE) operation. Although both the paired digit line sets (DL-1T/DL-1C and DL-2T/DL-2C) are shown extending to the same device 54, in other embodiments one of the digit line sets may extend to a different device than does the other.

Figure 8:
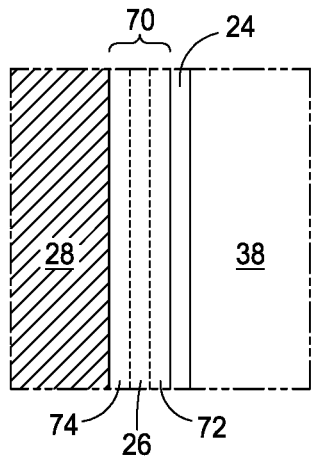
FIGS. 8-10 are diagrammatic cross-sectional views of regions of example assemblies.
Figure 9:
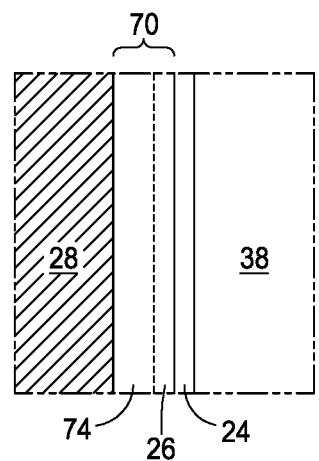
Figure 10:
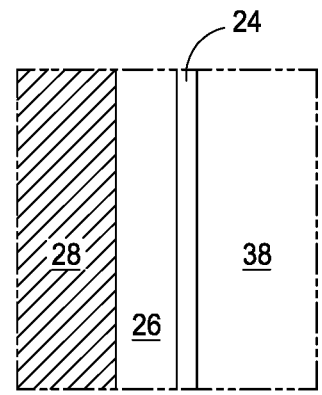

The ferroelectric material 26 of the ferroelectric transistor 14 of FIG. 1 may be utilized in MFMIS configurations, MFIS configurations, or any other suitable configurations. FIGS. 8-10 illustrate a few example configurations.

FIG. 8 shows a configuration in which the ferroelectric material 26 is within a stack 70 comprising the ferroelectric material between a pair of metal-containing materials 72 and 74 (a so-called MFM stack). Dashed lines are utilized to diagrammatically illustrate approximate boundaries between the various materials within the stack 70. The metal-containing materials 72 and 74 may comprise any suitable metals or metal-containing compositions; including, for example, one or more of tungsten, titanium, titanium nitride, etc. In some embodiments, the metal-containing material 72 may be referred to as an intervening conductive material between the ferroelectric material 26 and the insulative material 24.

FIG. 9 shows a configuration similar to that of FIG. 8, except that the stack 70 only comprises the metal-containing material 74 and the ferroelectric material 26. The configuration of FIG. 9 may be considered to be an example of an MFIS configuration.

FIG. 10 shows a configuration in which the ferroelectric material 26 is the only material between the insulative material 24 and the conductive gate material 28. The conductive gate material 28 may comprise metal adjacent to the ferroelectric material 26, and accordingly FIG. 10 may be considered to be another example of an MFIS configuration. It is noted that FIGS. 9 and 10 are basically the same configuration as one another, with the only difference being whether the metal of the MFIS configuration is defined as being part of the gate material 28, or is instead defined as being part of a separate stack 70. Analogously, the MFMIS configuration of FIG. 8 may include material of the gate 28 as the first metal of the MFMIS structure, rather than having such metal being considered to be part of the stack 70.

Figure 11:
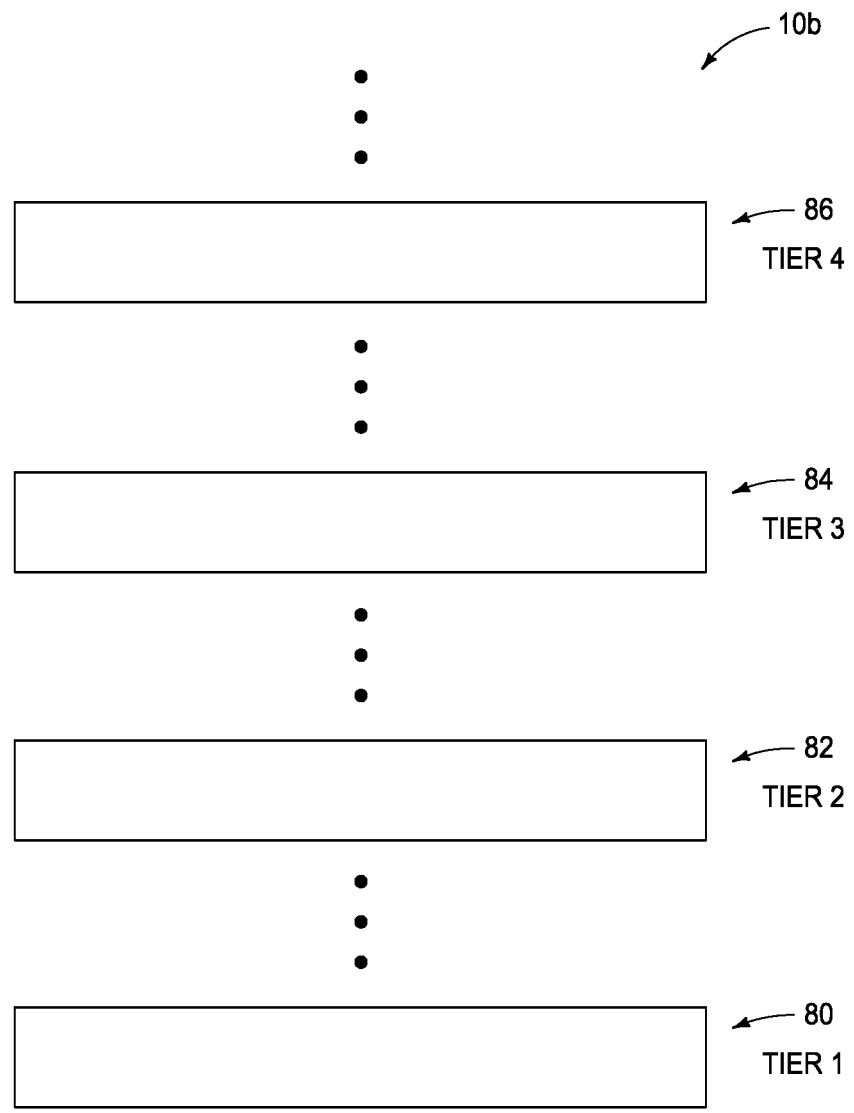
FIG. 11 is a diagrammatic cross-sectional side view of a region of an example assembly comprising stacked tiers.

In some embodiments, the memory array 52 may be within a memory tier (i.e., memory deck) which is within a vertically-stacked arrangement of tiers (or decks). For instance, FIG. 11 shows a portion of an integrated assembly 10b comprising a vertically-stacked arrangement of tiers 80, 82, 84 and 86 (also labeled as tiers 1-4). The vertically-stacked arrangement may extend upwardly to include additional tiers. The tiers 1-4 may be considered to be examples of levels that are stacked one atop the other. The levels may be within different semiconductor dies, or at least two of the levels may be within the same semiconductor die. The tiers may all be included in a single semiconductor package.

The bottom tier (tier 1) may include control circuitry and/or sensing circuitry (e.g., may include wordline drivers, sense amplifiers, etc.), and in some applications may comprise CMOS circuitry; and/or may include memory circuitry. The upper tiers (tiers 2-4) may include memory arrays, such as, for example, the memory array 52; and/or may include control circuitry or other logic circuitry. If memory arrays are within multiple tiers, the memory arrays within the various tiers may be the same as one another or may be different relative to one another.

The ferroelectric transistors described herein are example configurations. The embodiments described herein may be adapted for utilization in other ferroelectric transistors having other geometries, other channel configurations and/or other channel materials.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a ferroelectric transistor having a first electrode and a second electrode offset from the first electrode by an active region. A transistor gate is along a portion of the active region. The active region includes a first source/drain region adjacent the first electrode, a second source/drain region adjacent the second electrode, and a body region between the first and second source/drain regions. The body region includes a gated channel region adjacent the transistor gate. The active region includes at least one barrier between the second electrode and the gated channel region which is permeable to electrons but not to holes. Ferroelectric material is between the transistor gate and the gated channel region.

Some embodiments include an integrated assembly comprising a ferroelectric transistor. The ferroelectric transistor comprises an active region which extends vertically between a first electrode and a second electrode. The active region comprises a first source/drain region proximate the first electrode, a second source/drain region proximate the second electrode, and a body region between the first and second source/drain regions. The ferroelectric transistor includes a conductive gate proximate a segment of the body region. The segment is a gated channel region. The active region includes a first semiconductor composition extending from a surface of the first electrode, across the first source/drain region and across the gated channel region. The active region includes a second semiconductor composition extending from the first semiconductor composition to a surface of the second electrode. The first semiconductor composition comprises a semiconductor oxide, and the second semiconductor composition is compositionally different than the first semiconductor composition. A first comparative digit line is coupled with the first source/drain region. A second comparative digit line is coupled with the second source/drain region.

Some embodiments include an integrated assembly which comprises a ferroelectric transistor. The ferroelectric transistor includes a vertically-extending active region. The active region includes a first source/drain region, a second source/drain region, and a body region between the first and second source/drain regions. The active region includes two different semiconductor materials which join at an interface permeable to a first type of charge carrier and impermeable to a second type of charge carrier. One of the first and second types of charge carriers is electrons and the other of the first and second types of charge carriers is holes. The active region has a pair of opposing sidewalls along a cross-section. A first electrode is proximate the first source/drain region. A second electrode is proximate the second source/drain region. An insulative material is along each of the opposing sidewalls. A ferroelectric material is adjacent to the insulative material. A conductive gate material is adjacent to the ferroelectric material. A portion of the active region is overlapped by the conductive gate material, and is a gated portion of the active region. The first semiconductor material is directly against the first electrode and extends across the first source/drain region and the gated portion of the active region. The second semiconductor material is directly against the second electrode and extends from the first semiconductor material to the second electrode. A first comparative digit line is coupled with the first electrode. A second comparative digit line is coupled with the second electrode.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A ferroelectric transistor, comprising:
   a first electrode;
   a second electrode offset from the first electrode by an active region;
   a gate dielectric and a transistor gate along a portion of the active region;
   the active region including a first source/drain region adjacent the first electrode, a second source/drain region adjacent the second electrode, and a body region between the first and second source/drain regions; the body region including a gated channel region adjacent the transistor gate; the active region including at least one barrier between the second electrode and the gated channel region which is permeable to electrons but not to holes; and
   a layer of ferroelectric material between the transistor gate and the gated channel region, the layer of the ferroelectric material comprising a separate and distinct structure relative to the gate dielectric and the transistor gate.

2. The ferroelectric transistor of claim 1 wherein the at least one barrier includes a semiconductor heterojunction where a first semiconductor material directly contacts a second semiconductor material; the first and second semiconductor materials having first and second conduction bands, respectively, and having first and second valence bands, respectively; the first and second conduction bands being substantially energetically aligned with one another, and the first and second valence bands being offset relative to one another by at least about 0.5 volts.

3. The ferroelectric transistor of claim 2 wherein the first semiconductor material is a semiconductor oxide, and wherein the second semiconductor material comprises at least one element from Group 13 of the periodic table in combination with at least one element from Group 15 of the periodic table.

4. The ferroelectric transistor of claim 3 wherein the second semiconductor material comprises one or more of GaP, AlAs, GaAs, AlP, InP, AlSb, GaAlAs, GaInAs, GaInP; where the chemical formulas indicate primary constituents rather than specific stoichiometries.

5. The ferroelectric transistor of claim 4 wherein the second semiconductor material further includes one or more of silicon, carbon and germanium.

6. The ferroelectric transistor of claim 4 wherein the first semiconductor material comprises one or more of indium, zinc, tin and gallium.

7. The ferroelectric transistor of claim 6 wherein the first semiconductor material further includes one or more of hydrogen, magnesium, yttrium and fluorine.

8. The ferroelectric transistor of claim 2 wherein the first semiconductor material comprises SnO, where the chemical formula indicates primary constituents rather than a specific stoichiometry; and wherein the second semiconductor material comprises GaP, where the chemical formula indicates primary constituents rather than a specific stoichiometry.

9. The ferroelectric transistor of claim 1 wherein the at least one barrier includes a junction where a heavily n-type doped semiconductor material directly contacts another material.

10. The ferroelectric transistor of claim 1 wherein the source/drain regions are n-type semiconductor material; wherein the first and second electrodes comprise metal; and wherein the at least one barrier includes a junction where the n-type semiconductor material of the second source/drain region directly contacts the metal of the second electrode.

11. The ferroelectric transistor of claim 1 wherein the active region comprises at least two barriers.

12. The ferroelectric transistor of claim 1 wherein an entire structure of the at least one barrier comprises an interface.

13. The ferroelectric transistor of claim 1 wherein the at least one barrier directly contacts the second electrode.

14. The ferroelectric transistor of claim 1 wherein the at least one barrier directly contacts a metal.

15. The ferroelectric transistor of claim 1 wherein the ferroelectric material is in a stack between a pair of metal-containing materials.

16. The ferroelectric transistor of claim 1 wherein the ferroelectric material is in a stack comprising a metal-containing material.

17. The ferroelectric transistor of claim 1 wherein the ferroelectric material is on opposite sides of the gated channel region.

18. The ferroelectric transistor of claim 2 wherein the first and second semiconductor materials join at an interface, and wherein the interface is a boundary of the second source/drain region.

19. The ferroelectric transistor of claim 2 wherein the first and second semiconductor materials join at an interface, and wherein the interface is not a boundary of the second source/drain region.

20. The ferroelectric transistor of claim 2 wherein the second semiconductor material is n-type, and comprises n-type dopant therein to a concentration of at least about $10^{19}$ atoms/cm$^3$.

21. The ferroelectric transistor of claim 2 wherein the second semiconductor material comprises n-type silicon.

22. The ferroelectric transistor of claim 1 wherein the transistor gate is adjacent the layer of the ferroelectric material.

23. The ferroelectric transistor of claim 1 wherein the first and second electrodes each comprise metal directly against the active region.

24. The ferroelectric transistor of claim 1 wherein the at least one barrier comprises at least one of the following: carbon, zinc, tin, hydrogen, oxygen, magnesium, yttrium, fluorine, AlAs, AlP and GaInAs.

25. The ferroelectric transistor of claim 1 wherein the ferroelectric material directly contacts a metal layer.

26. The ferroelectric transistor of claim 1 wherein the ferroelectric material directly contacts a first metal layer on a first side of the ferroelectric material and directly contacts a second metal layer on an opposite second side of the ferroelectric material.

27. The ferroelectric transistor of claim 1 wherein the layer of the ferroelectric material directly contacts the gate dielectric.

28. The ferroelectric transistor of claim 1 wherein the layer of the ferroelectric material directly contacts a metal layer on a first side of the layer of the ferroelectric material and directly contacts the gate dielectric on an opposite second side of the ferroelectric material.

29. The ferroelectric transistor of claim 1 wherein the layer of the ferroelectric material extends along, and having a greater length than, a length of the gated channel region.

30. The ferroelectric transistor of claim 1 wherein the layer of the ferroelectric material extends along, and having a greater length than, a length of the transistor gate.

31. The ferroelectric transistor of claim 1 wherein the layer of the ferroelectric material is spaced from the gated channel region only by the gate dielectric.

\* \* \* \* \*